(12) United States Patent
Ebner

(10) Patent No.: US 9,714,753 B2
(45) Date of Patent: Jul. 25, 2017

(54) ASSEMBLY FOR EMITTING LIGHT HAVING AN LED, A CIRCUIT BOARD, AND AN OPTICAL ELEMENT

(71) Applicant: ZUMTOBEL LIGHTING GMBH, Dornbirn (AT)

(72) Inventor: Stephan Ebner, Dornbirn (AT)

(73) Assignee: ZUMTOBEL LIGHTING GMBH, Dornbirn (AT)

( * ) Notice: Subject to any disclaimer, the term of this patent is extended or adjusted under 35 U.S.C. 154(b) by 0 days.

(21) Appl. No.: 14/778,456

(22) PCT Filed: Mar. 19, 2014

(86) PCT No.: PCT/EP2014/055508
§ 371 (c)(1),
(2) Date: Sep. 18, 2015

(87) PCT Pub. No.: WO2014/147126
PCT Pub. Date: Sep. 25, 2014

(65) Prior Publication Data
US 2016/0265738 A1    Sep. 15, 2016

(30) Foreign Application Priority Data

Mar. 20, 2013 (DE) .................. 20 2013 101 190 U

(51) Int. Cl.
*F21V 1/00* (2006.01)
*F21V 5/04* (2006.01)
(Continued)

(52) U.S. Cl.
CPC .................. *F21V 5/04* (2013.01); *F21K 9/00* (2013.01); *F21V 17/02* (2013.01); *F21V 23/02* (2013.01);
(Continued)

(58) Field of Classification Search
CPC .......... H05K 3/30; H05K 3/303; H05K 3/301; H01R 33/09; F21V 19/001; F21V 19/003;
(Continued)

(56) References Cited

U.S. PATENT DOCUMENTS

| | | | |
|---|---|---|---|
| 6,255,768 B1 * | 7/2001 | Gorski et al. | H01J 3/022 313/307 |
| 7,058,309 B1 | 6/2006 | Eisenberger et al. | |

(Continued)

FOREIGN PATENT DOCUMENTS

| | | |
|---|---|---|
| DE | 19834090 | 2/2000 |
| DE | 102006015377 | 10/2007 |

(Continued)

OTHER PUBLICATIONS

International Search Report for PCT/EP2014/055508, English translation attached to original, Both completed by the European Patent Office on May 2, 2014, 6 Pages.

*Primary Examiner* — Y M. Lee
(74) *Attorney, Agent, or Firm* — Brooks Kushman P.C.

(57) ABSTRACT

An assembly for emitting light including a circuit board, an LED for producing a light, wherein the LED is arranged on the circuit board, an optical element, which is arranged in such a way that the optical element optically influences the light produced by the LED, and a spacing element, wherein the spacing element is arranged between the optical element and the circuit board.

16 Claims, 5 Drawing Sheets

(51) Int. Cl.
*F21K 9/00* (2016.01)
*F21V 17/02* (2006.01)
*F21V 23/02* (2006.01)
*H05K 3/30* (2006.01)
*F21V 5/00* (2015.01)
*F21V 7/00* (2006.01)
*F21V 17/00* (2006.01)
*F21V 17/10* (2006.01)
*F21V 23/00* (2015.01)
*F21Y 105/10* (2016.01)
*F21Y 115/10* (2016.01)
*F21Y 101/02* (2006.01)

(52) U.S. Cl.
CPC ............. *F21V 5/007* (2013.01); *F21V 7/0091* (2013.01); *F21V 17/005* (2013.01); *F21V 17/10* (2013.01); *F21V 23/005* (2013.01); *F21Y 2101/02* (2013.01); *F21Y 2105/10* (2016.08); *F21Y 2115/10* (2016.08); *H05K 3/30* (2013.01); *H05K 3/301* (2013.01); *H05K 3/303* (2013.01)

(58) Field of Classification Search
CPC ........ F21V 19/042; F21V 19/045; F21V 5/04; F21V 23/02
See application file for complete search history.

(56) References Cited

U.S. PATENT DOCUMENTS

| | | |
|---|---|---|
| 8,646,990 B2 | 2/2014 | Singer et al. |
| 2006/0098308 A1 | 5/2006 | Angelini et al. |
| 2007/0228392 A1 | 10/2007 | Plank et al. |
| 2007/0228516 A1* | 10/2007 | Plank et al. ........ H01L 25/0753 257/531 |
| 2011/0032707 A1 | 2/2011 | Takashige et al. |
| 2012/0063143 A1 | 3/2012 | Park et al. |
| 2014/0160751 A1* | 6/2014 | Hogan et al. ........... H01S 5/005 362/311.01 |

FOREIGN PATENT DOCUMENTS

| | | |
|---|---|---|
| DE | 102008039147 | 12/2009 |
| WO | 2004053933 | 6/2004 |

* cited by examiner

ASSEMBLY FOR EMITTING LIGHT HAVING AN LED, A CIRCUIT BOARD, AND AN OPTICAL ELEMENT

CROSS-REFERENCE TO RELATED APPLICATION

This application is the U.S. national phase of PCT Application No. PCT/EP2014/055508 filed on Mar. 19, 2014, which claims priority to DE Patent Application No. 20 2013 101 190.8 filed on Mar. 20, 2013, the disclosures of which are incorporated in their entirety by reference herein.

The invention relates to an assembly for emitting light having an LED (LED: Light Emitting Diode), a circuit board and an optical element.

The prior art discloses corresponding arrangements wherein the LED and the optical element are arranged on the circuit board and a light generated by the LED is influenced here by the optical element in a specific desired manner, for example in order to obtain a particular angular emission range of the light emission of the assembly. Corresponding optical elements in the form of reflectors, on the one hand, and lens optical units, on the other hand, are customary here. The latter have significant light-technological advantages over reflectors, in principle. However, lens optical units are typically produced using injection molding technology, such that in principle a significantly greater outlay is required to produce them—in comparison with reflectors. In particular, corresponding production tools for such optical elements are very costly.

Figure 4:
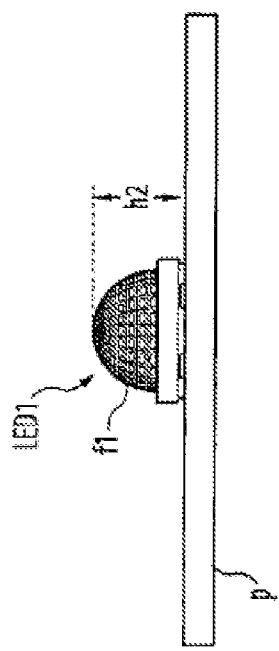

LEDs are known in very many different types or designs. FIG. 4 shows by way of example an LED of a first type LED1 arranged on a circuit board p, and FIG. 5 correspondingly shows an LED of a second type LED2. The LED of the first type LED1 has a structural height h1 that is greater than the structural height h2 of the LED of the second type LED2. In this case, "structural height" shall denote the extent of the relevant LED above the surface of the circuit board if the LED is arranged as envisaged on the circuit board, or the maximum height of the light emission surface of the LED with respect to the surface of the circuit board p. The two LEDs LED1, LED2 also differ in the shape of the light emission surface. The light emission surface f1 is hemispherical in the case of the LED of the first type LED1, and the light emission surface f2 is planar in the case of the LED of the second type LED2.

Figure 6:
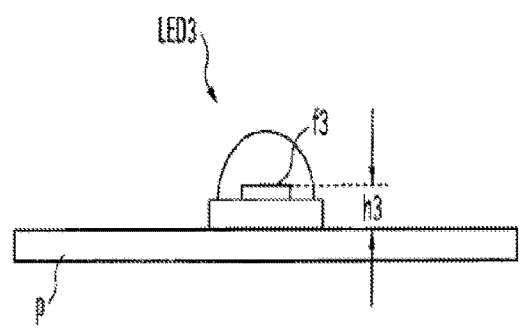

In the case of the LED1 depicted schematically in FIG. 4, phosphor particles are situated in the hemispherical cover and serve for wavelength conversion, such that the surface of said cover constitutes the light emission surface f1 of the LED. FIG. 6 schematically depicts an example of an LED of a third type LED3, wherein the light emission surface f3 is situated at a height h3 since here the hemispherical cover does not contain any phosphor particles, such that the planar surface designated by f3 should be regarded as the light emission surface.

Accordingly, LEDs generally differ in the manner of their light emission, such that producing a corresponding assembly necessitates fashioning the optical element in a manner dependent on the relevant LED—or the LED in a manner dependent on the relevant optical element. In particular, it should be taken into consideration here that a corresponding optical element typically has to be arranged at a specific distance from the light emission surface of the LED in order to obtain the desired light influencing. Therefore, the production of corresponding different assemblies requires a considerable outlay.

The invention is based on the object of specifying a corresponding improved assembly. In particular, the assembly is intended to be suitable for cost-effective production.

This object is achieved according to the invention by means of the subject matter mentioned in the independent claim. Particular embodiments of the invention are specified in the dependent claims.

The invention provides an assembly for emitting light which comprises a circuit board and an LED for generating a light, wherein the LED is arranged on the circuit board. Furthermore, the assembly comprises an optical element, which is arranged in such a way that it optically influences the light generated by the LED. Moreover the assembly comprises a spacer element, wherein the spacer element is arranged between the optical element and the circuit board.

What can be achieved by means of the spacer element is that it is possible to choose for the assembly an optical element with which the desired light influencing would not be obtained if it were arranged directly on the circuit board. This makes it possible to dispense with the manufacture of a special optical element for the production of the assembly. The assembly can therefore be manufactured particularly cost-effectively.

In other words, what can be achieved is that a specific optical element is suitable for different LEDs, in particular for LEDs which differ in terms of their structural height and/or in terms of the position of the LED chip within the LED housing. At least within certain physical limits, a corresponding optical element, by virtue of the assembly according to the invention, is also suitable for LEDs which differ in terms of the size and/or shape of the light emission surface.

Furthermore, the spacer element makes it possible to achieve a facilitated positioning of the optical element relative to the circuit board. A more extensive simplification of the production of the arrangement can be brought about as a result.

Preferably, the spacer element comprises a ceramic material. Advantageously, the spacer element consists of a ceramic material. This makes it possible practically to rule out a situation where the spacer element has undesirable electrical effects on further components of the circuit board or of the assembly.

Preferably, the spacer element is formed by an electrical or electronic component, for example by an electrical resistor or a jumper. In this way, the spacer element can advantageously be fashioned such that it not only functions as a spacer, but also fulfills a corresponding further function. A corresponding separate electrical or electronic component can be obviated as a result.

Particularly simple mounting of the spacer element on the circuit board is made possible if the electrical or electronic component is formed by a surface mounted component or an SMD (SMD: surface mounted device) or is arranged on the circuit board by surface mounting. In this case, the circuit board can also be populated in a particularly suitable manner, in particular populated automatically, with the spacer element. Advantageously, for example, the spacer element is formed by a zero ohm resistor.

Particularly simple production of the assembly is furthermore made possible if the spacer element is arranged directly on the circuit board.

Preferably, in this case an LED module having an integrated height positioning for the optical element is formed by the circuit board, the LED and the spacer element.

If the optical element is arranged in a manner connected directly to the spacer element, a further component can be avoided and the assembly can be embodied particularly stably in a simple manner. The optical element is preferably arranged in a manner retained mechanically on the spacer element. A separate holding element for retaining the optical element on the circuit board can be obviated as a result.

The optical element is preferably a lens element. It can be formed advantageously, for example, by a lens, a lens array, a lens plate, a plastic optical plate, etc. The assembly is particularly suitable if the optical element is produced using injection molding technology or by extrusion.

A further advantageous design is provided if the assembly furthermore comprises at least one further LED for generating a further light, wherein the optical element is designed and arranged in such a way that it also optically influences the further light generated by the at least one further LED. In this way, a separate optical element need not be provided for each LED of the assembly.

The spacer element is furthermore advantageously configured as a positioning aid element for positioning the optical element relative to the LED and/or relative to the circuit board. In particular, the spacer element can be embodied as a positioning aid element for securing a longitudinal position of the optical element and/or for securing a specific rotational position of the optical element relative to the LED and/or to the circuit board. In this way, the optical element can be positioned particularly simply relative to the circuit board and/or to the LED or the LEDs. Consequently, the production of the assembly is facilitated by this means as well.

Figure 1:
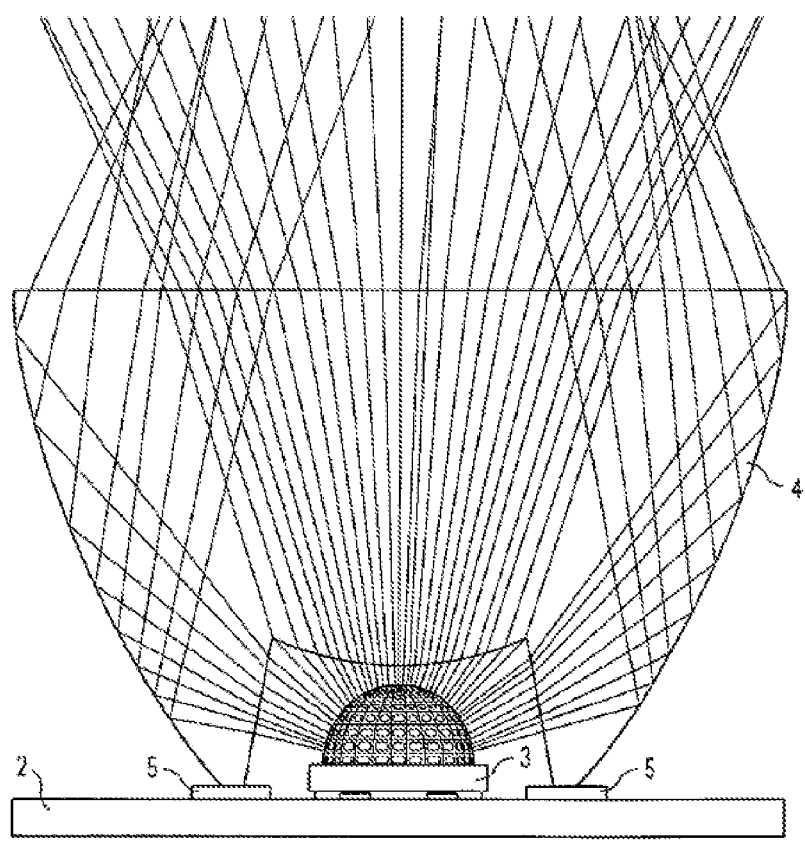
Figure 2:
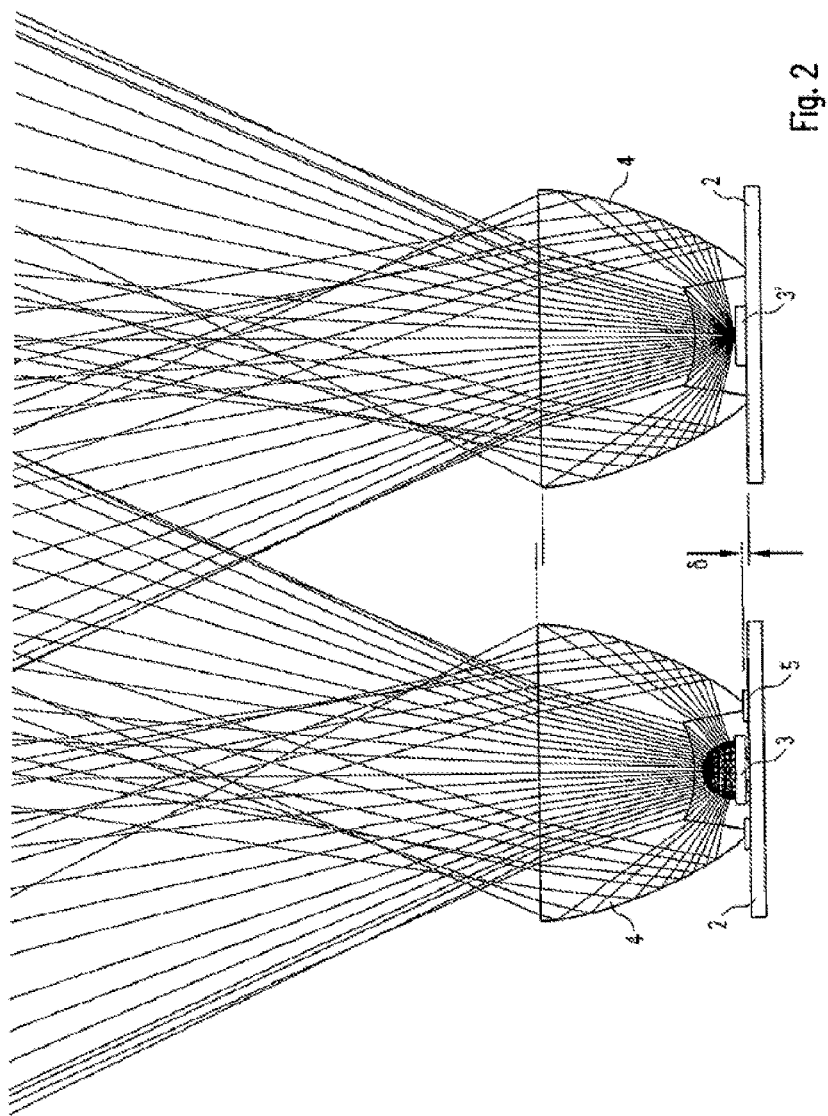
Figure 3:
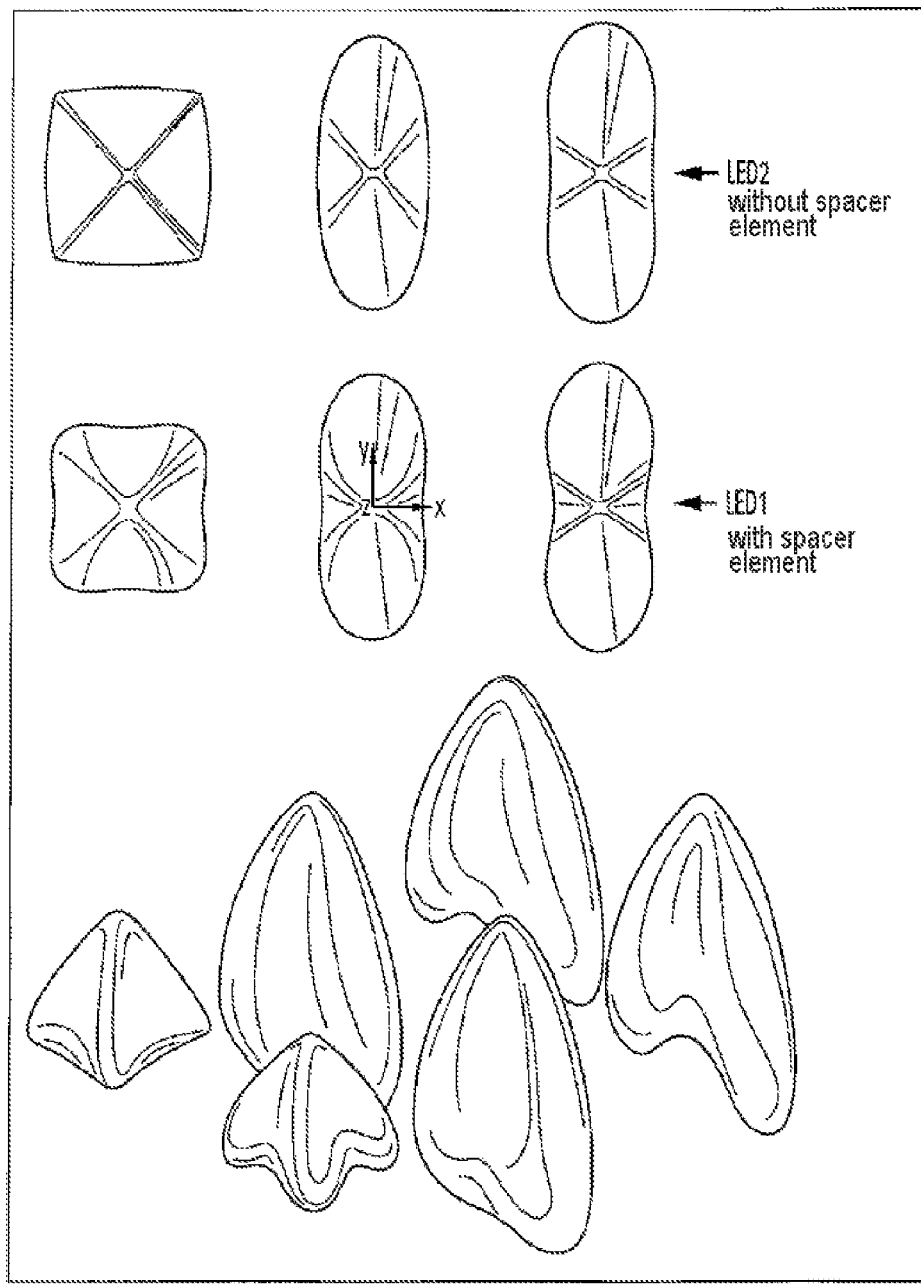

The invention is explained in greater detail below on the basis of an exemplary embodiment and with reference to the drawings, in which:

FIG. 1 shows a cross-sectional schematic diagram containing an assembly according to the invention, FIG. 2 shows a cross-sectional schematic diagram concerning two assemblies comprising two different LEDs, FIG. 3 shows a schematic diagram for illustrating the light influencing in the case of the two assemblies depicted schematically in FIG. 2, and FIGS. 4 to 6 show three schematic diagrams concerning different LEDs in accordance with the prior art.

FIG. 1 shows a schematic cross-sectional illustration of an assembly for emitting light according to the invention. The assembly comprises a circuit board 2, and also an LED 3 for generating a light. The LED 3 is arranged on the circuit board 2, in particular directly on the circuit board 2. Preferably, the LED 3 is arranged as a surface mounted component on the circuit board 2, or as an SMD.

Furthermore, the assembly comprises an optical element 4, which is arranged in such a way that it optically influences the light generated by the LED 3, for example by focusing. The optical element 4 is for example a lens element, for example in the form of a lens array, a lens plate or a plastic optical plate.

Preferably, the assembly is fashioned in such a way that the light generated by the LED 3 can leave the assembly only if it has previously been influenced by the optical element 4, in particular has passed through the optical element 4. Accordingly, the optical element 4 is preferably fashioned such that it is arranged in a manner extending around the LED 3 or the light emission surface thereof.

The optical element 4 can be produced using injection molding technology or by extrusion, for example. Producing the optical element 4 by injection molding technology necessitates a corresponding production tool, such that the production of the optical element 4 makes up an appreciable proportion of the total outlay required overall for producing the assembly.

Furthermore, the assembly comprises a spacer element 5 which is arranged between the optical element 4 and the circuit board 2. The spacer element 5 serves for obtaining a specific distance between the optical element 4 and the circuit board 2. In particular, provision can be made for the spacer element 5 to be arranged directly on the circuit board 2 and/or for the optical element 4 to be arranged in a manner connected directly to the spacer element 5, in particular to be retained mechanically on the latter. In this way, no further components are required for obtaining the desired distance or for retaining the optical element 4.

What can be achieved by means of the spacer element 5 is that the optical element 4 is arranged at a distance from the circuit board 2 and thus from the LED 3 such that it brings about a specific desired optical influencing of the light generated by the LED 3. In the example shown, the light generated and emitted by the LED 3 is focused by the optical element 4. In this case, the optical effect or focusing effect is dependent on the distance between the circuit board 2 and the optical element 4, such that the optical effect can be influenced by variation of said distance. A specific distance and thus a specific optical effect can be achieved by means of the spacer element 5.

Figure 5:
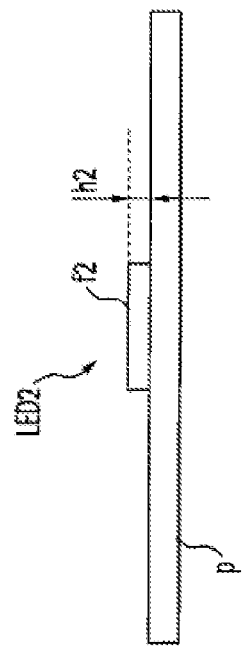

The advantage of the spacer element 5 shall be illustrated more extensively by way of example with reference to FIG. 2. The reference signs are used analogously. FIG. 2 shows a reduced reproduction of the assembly depicted schematically in FIG. 1, also designated hereinafter as "first" assembly. A second assembly is depicted schematically alongside the first assembly, said second assembly differing from the first assembly inter alia in terms of the type of LED used. While the LED 3 of the first assembly is the LED of the "first" type as shown in FIG. 4, the second assembly comprises an LED—here designated by 3'—such as is shown in FIG. 5, that is to say an LED of the "second" type. The two LEDs 3, 3' differ, as explained in the introduction, in terms of their structural heights, in particular.

Both assemblies comprise the same optical element 4.

In the case of the second assembly, the conditions are now such that the optical element 4 is arranged directly on the circuit board 2 and a desired light emission of the assembly is obtained in this way. In the case of the first assembly, by contrast, the optical element 4—as explained above—is connected to the circuit board 2 via the spacer element 5, such that a small distance δ between the circuit board 2 and the optical element 4 is provided or defined here, in contrast to the second assembly. What can be achieved by means of said distance δ is that the optical element 4 of the first assembly brings about an emission of the first assembly which is practically identical to the emission of the second assembly. This is indicated by light rays drawn by way of example for the two assemblies in FIG. 2.

Without the use of the spacer element 5, the emission of the first assembly would differ from the emission of the second assembly in a clearly perceptible manner. In the case of the first assembly without the use of the spacer element 5, the optical element 4 would not be able to influence the light in a desired manner.

It has been customary hitherto to develop a special lens optical unit for a special type of LED. What can now be achieved by means of the assembly according to the invention is that an optical element is suitable for obtaining a specific light emission behavior in corresponding assemblies that differ with regard to the type of LED used. The range of use of corresponding, relatively expensive optical elements can thus be increased.

The spacer element 5 is preferably fashioned in such a way that the distance δ between the circuit board 2 and the optical element 4 is smaller than the structural height of the LED 3. In the example shown, the distance δ is less than half of the structural height of the LED 3. The LED 3, as mentioned, is preferably an SMD. The structural height of the LED 3 is accordingly small, preferably less than 5 mm, in particular less than 4 mm, particularly preferably less than 2 mm.

The effect described is illustrated more extensively in FIG. 3. An approximately pyramid-like light emission figure is shown in the upper line, on the left, said figure symbolically illustrating the emission behavior of the second assembly—from the viewing angle of the LED. A corresponding light emission figure for the first assembly—that is to say using the spacer element 5—is depicted schematically underneath in the second line. These two light emission figures are reproduced in perspective view in the bottom region of the drawing. It is evident that the two light emission figures, that is to say the emission behaviors of the two assemblies, practically do not differ.

A corresponding effect can also be achieved for differently acting optical elements. This is depicted schematically by way of example in FIG. 3 on the basis of corresponding light emission figures in the case of two further optical elements (not shown as such).

The assembly can furthermore comprise at least one further spacer element which is fashioned analogously to the first-mentioned spacer element 5. In particular, the assembly can be fashioned in such a way that it comprises, instead of the first-mentioned spacer element 5, said first-mentioned spacer element 5 and the at least one further spacer element, wherein the described effect of the relevant parts is identical in both cases. Therefore, only the expression "the" spacer element 5 is used hereinafter, although this expression is also intended to encompass a corresponding plurality of spacer elements. From a different standpoint or in other words, the (first-mentioned) spacer element 5 can be fashioned in a multipartite manner.

Preferably, the spacer element 5 is arranged in a small surrounding region with respect to the LED 3 on the circuit board 2, such that a particularly stable support of the optical element 4 is made possible. In this case, the diameter of the surrounding region is preferably less than five times the diameter of the LED 3, preferably less than three times the diameter of the LED 3.

The spacer element 5 can comprise a ceramic material. It can in particular consist of a ceramic material. In this way, an undesirable electrical interaction with further components of the assembly, in particular electronic components with which the circuit board 2 is populated, can be practically avoided.

However, the spacer element 5 can also be formed by an electrical or electronic component, for example by an electrical resistor or by a jumper. By way of example, the spacer element can be formed by a zero ohm resistor.

As a result, an advantageous double function of the spacer element 5 can be obtained, this enabling a corresponding separate component of the assembly to be obviated. In this case, a surface mounted component or an SMD can particularly advantageously be involved, such that particularly simple, in particular automated, population of the circuit board with the spacer element is made possible. In this way, the spacer element 5 can be arranged on the circuit board 2 advantageously in terms of production engineering in a work process in which the circuit board 2—as customary per se—is populated with electrical or electronic components. The spacer element 5 is therefore advantageously arranged on the circuit board 2 by surface mounting.

The use of surface mounting is in particular also advantageous in the manufacture of corresponding different assemblies that differ in the type or design of the LED respectively used, but not in the design of the optical element. In this case, the respective circuit boards with the LEDs, that is to say the LED modules, in the context of population can be provided or populated in each case with a suitable spacer element correspondingly coordinated with the design of the LED used, such that the type or design of the respective LED and the interaction thereof with the relevant optical element need no longer be taken into account separately in the further manufacturing process. The spacer element 5 can bring about as it were a "height positioning that is integrated" into the LED module for the optical element 4.

During the manufacture of corresponding different assemblies, the optical element can accordingly preferably be fashioned such that—without the use of a spacer element—it is suitable as desired for that one of the LEDs used which has the smallest structural height. For LEDs of different type, it is then possible to provide in each case a spacer element which has a corresponding height coordinated with the respective type of LED or ensures a corresponding distance δ.

In the example depicted schematically in FIG. 1, the LED 3 constitutes the sole LED of the assembly. In general, however, the assembly can also comprise a plurality of LEDs, that is to say in addition at least one further LED for generating a further light. In this case, the at least one further LED is preferably fashioned analogously to the first-mentioned LED 3.

Advantageously, in this case the optical element 4 is fashioned and arranged in such a way that it also optically influences the further light generated by the at least one further LED. In such a case, the optical element is typically fashioned such that it is correspondingly larger and the abovementioned embodiment of the spacer element in multipartite form can be particularly advantageous here. The optical element then has to be supported with corresponding spacer element parts only at two or more locations in order to ensure the distance δ.

A further advantageous configuration of the spacer element 5 arises if the latter is also configured as a positioning aid element for positioning the optical element 4 relative to the LED 3 and/or the circuit board 2. In particular, it can be embodied here for securing a longitudinal position of the optical element 4 and/or for securing a specific rotational position of the optical element 4 relative to the LED 3 and/or to the circuit board 2. The design as positioning aid element enables a defined positioning for the optical element 4, as a result of which the light influencing obtained by means of the optical element 4 can be brought about particularly reliably and simply.

The assembly according to the invention enables a particularly cost-effective and space-saving configuration. It is particularly convenient in terms of manufacture. The stray light behavior in the emission characteristic of the assembly can be improved appropriately with respect to the relevant LED.

The invention claimed is:
1. An assembly for emitting light, comprising:
a circuit board, an LED for generating a light, wherein the LED is arranged on the circuit board, an optical element, which is arranged in such a way that it optically influences the light generated by the LED, and a spacer element consists of ceramic material, wherein the spacer element is arranged between the optical element and the circuit board, the spacer element establishing a distance δ between the circuit board and the optical element which is smaller than a structural height of the LED above the circuit board, wherein the optical element is retained on the spacer element.

2. The assembly as claimed in claim 1, wherein the spacer element is formed by an electrical or electronic component which is a surface mounted on the circuit board.

3. The assembly as claimed in claim 1, wherein the optical element is a lens element.

4. The assembly as claimed in claim 3, wherein the optical element is formed by a lens, a lens array, a lens plate or a plastic optical plate.

5. The assembly as claimed in claim 1, wherein the optical element is produced using injection molding technology or by extrusion.

6. The assembly as claimed in claim 1, furthermore comprising at least one further LED for generating a further light, wherein the optical element is arranged in such a way that it also optically influences the further light generated by the at least one further LED.

7. The assembly as claimed in claim 1, wherein the spacer element is configured as a positioning aid element for positioning the optical element relative to the LED and/or relative to the circuit board.

8. The assembly as claimed in claim 7, wherein the spacer element is embodied as a positioning aid element for securing a position of the optical element relative to the LED and/or to the circuit board.

9. An assembly for emitting light, comprising:

a circuit board, an LED for generating a light, wherein the LED is arranged on the circuit board, an optical element, which is arranged in such a way that it optically influences the light generated by the LED, and a spacer element arranged between the optical element and the circuit board;

wherein the spacer element is formed by a zero ohm resistor.

10. The assembly as claimed in claim 9, wherein the spacer element is arranged directly on the circuit board.

11. The assembly as claimed in claim 10, wherein an LED module having an integrated height positioning for the optical element is formed by the circuit board, the LED and the spacer element.

12. An assembly for emitting light, comprising:

a circuit board, an LED for generating a light, wherein the LED is arranged on the circuit board, an optical element, which is arranged in such a way that it optically influences the light generated by the LED, and a spacer element, wherein the spacer element is arranged between the optical element and the circuit board, the spacer element establishing a distance δ between the circuit board and the optical element which is smaller than a structural height of the LED above the circuit board, wherein the optical element is connected directly to the spacer element.

13. The assembly as claimed in claim 12, wherein the spacer element is configured as a positioning aid element for positioning the optical element relative to the LED and/or relative to the circuit board.

14. An assembly for emitting light, comprising:

a circuit board, an LED for generating a light, wherein the LED is arranged on the circuit board, an optical element, which is arranged in such a way that it optically influences the light generated by the LED, and a spacer element, wherein the spacer element is arranged between the optical element and the circuit board and is formed by an electrical or electronic component;

wherein the spacer element is formed by a zero ohm resistor.

15. The assembly as claimed in claim 14, wherein the spacer element is arranged directly on the circuit board.

16. The assembly as claimed in claim 14, wherein the optical element is a lens element.

* * * * *